US010823781B1

(12) United States Patent
Schat (10) Patent No.: US 10,823,781 B1
(45) Date of Patent: Nov. 3, 2020

(54) INTERNALLY CLOCKED LOGIC BUILT-IN SELF-TEST APPARATUSES AND METHODS

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/581,869

(22) Filed: Sep. 25, 2019

(51) Int. Cl.
| | |
|---|---|
| G01R 31/28 | (2006.01) |
| G01R 31/317 | (2006.01) |
| G01R 31/3177 | (2006.01) |
| G11C 29/12 | (2006.01) |
| G01R 31/319 | (2006.01) |
| G01R 31/3187 | (2006.01) |

(52) U.S. Cl.
CPC ... *G01R 31/31724* (2013.01); *G01R 31/3177* (2013.01); *G01R 31/3187* (2013.01); *G01R 31/31922* (2013.01); *G11C 29/12* (2013.01)

(58) Field of Classification Search
CPC .......... G01R 31/31724; G01R 31/3177; G01R 31/3187; G01R 31/319; G01R 31/31901; G01R 31/31905; G01R 31/31915; G01R 31/31922; G11C 29/12; G06F 11/27
USPC ................... 714/724, 725, 733, 734
See application file for complete search history.

(56) References Cited

U.S. PATENT DOCUMENTS

| | | | |
|---|---|---|---|
| 6,480,817 B1 | 11/2002 | Peters et al. | |
| 2004/0103355 A1* | 5/2004 | Correale, Jr. et al. | ............ G01R 31/28 |
| 2017/0350940 A1* | 12/2017 | Huott et al. | ...... G01R 31/31724 |
| 2019/0318135 A1* | 10/2019 | Schat | ...................... G06F 21/85 |

OTHER PUBLICATIONS

Towards Single Pin Scan for Extremely Low Pin Count Test, Mudasir S. Kawoosa, Rajesh K. Mittal, Maheedhar Jalasuthram and Rubin A. Parekhji, 31st International Conference on VLSI Design and 2018 17th International Conference on Embedded Systems, p. 97-102.
Solutions for undetected Shorts on IEEE 1149.1 Self-Monitoring Pins, CJ Clark, Dave Dubberke, Kenneth P. Parker, Bill Tuthill, International Test Conference 2010, paper 19.1.
Fast BIST of I/O Pin AC Specifications and Inter-Chip Delays, Stephen Sunter, Saghir A. Shaikh, Qing Lin, International Test Conference 2014, paper 7.3, p. 1-8.

(Continued)

*Primary Examiner* — Christine T. Tu
(74) *Attorney, Agent, or Firm* — Rajeev Madnawat (57) ABSTRACT

Embodiments are directed to apparatuses and methods for providing a logic built-in self-test (LBIST) using an LBIST logic circuit and an auxiliary logic circuit. An example method includes using switch circuitry in an integrated circuit (IC) to change modes of operation associated with functional logic circuit, the modes of operation including an LBIST mode and an application mode, and to provide an internally generated digital clock signal to the functional logic circuitry and an LBIST logic circuit in response to the LBIST mode. The method further includes performing an LBIST using the internally generated digital clock signal, the LBIST logic circuit to test select nodes in the IC via control of the functional logic circuitry and via application of digital logic sequences provided as inputs to the I/O pad cells of the IC.

20 Claims, 9 Drawing Sheets

(56) References Cited

OTHER PUBLICATIONS

Pre-Assembly Testing of Interconnects in Embedded Multi-Die Interconnect Bridge (EMIB) Dies, Sudipta Mondal and Krishnendu Chakrabarty, Design, Automation and Test in Europe 2018, p. 373-378.
"GPIO Electrical Specifications—Raspberry Pi input and output pin voltage and current capability", Mosaic Industries, 7 pgs., retrieved from the Internet Aug. 15, 2019 at: http://www.mosaic-industries.com/embedded-systems/microcontroller-projects/raspberry-pi/gpio-pin-electrical-specifications?do=print_preview.
Walleij, L. et al. "Pin Control Sybsystem—Building Pins and Gpio from the ground up", Linaro, ST Ericsson, 33 pgs., retrieved from the Internet Aug. 15, 2019 at: https://elinux.org/images/b/b6/Pin_Control_Subsystem_Overview.pdf.

\* cited by examiner

INTERNALLY CLOCKED LOGIC BUILT-IN SELF-TEST APPARATUSES AND METHODS

OVERVIEW

Aspects of various embodiments are directed to apparatuses and methods involving an internally clocked logic built-in self-test (LBIST).

A scan test performed by an on-chip test module, often referred to as an LBIST, may be used for safety-critical integrated circuits (ICs). Generally, an LBIST includes the use of test access ports (TAPs) for initiating and clocking an internal LBIST circuit that performs the LBIST. TAP pad cells may be shared with functional pads. When used as TAP pads, the direction of the shared TAP pad cell may be fixed to either input or output for the LBIST and the pad cell parameters may be fixed to a constant value that is suitable for the respective test.

These and other matters have presented challenges to efficiencies of LBIST implementations, for a variety of applications.

SUMMARY

Various example embodiments are directed to issues such as those addressed above and/or others which may become apparent from the following disclosure concerning performing a logic built-in self-test (LBIST) using an internally generated digital clock signal.

In certain example embodiments, aspects of the present disclosure involve an LBIST in which any input/output (I/O) pad cell path may be tested in the field using an auxiliary logic circuit.

In a more specific example embodiment, a method is directed to providing an LBIST for an integrated circuit (IC) using an LBIST logic circuit and an auxiliary logic circuit. The method includes using switch circuitry in an IC, the IC including functional logic circuitry and I/O pad cells, to change modes of operation associated with the functional logic circuitry, the modes of operation including an LBIST mode and an application mode, and to provide an internally generated digital clock signal to the functional logic circuitry and an LBIST logic circuit of the IC in response to the LBIST mode. The method further includes performing an LBIST using the internally generated digital clock signal, the LBIST logic circuit and the auxiliary logic circuit to test select nodes in the IC via control of the functional logic circuitry and via application of digital logic sequences provided as inputs to the I/O pad cells of the IC. As further described herein, performing the LBIST can include providing the LBIST logic circuit access to all pad cell paths of the I/O pad cells of the IC.

In related embodiments, generating the digital clock signal includes using a phase locked loop circuit of the IC. Further, performing the LBIST includes using the internally generated digital clock signal to start the LBIST and clock the LBIST logic circuit and testing internal paths from a pad cell driver to a pad cell receiver of shared Test Access Port (TAP) pad cells of the I/O pad cells using the application of at least a portion of digital logic sequences provided as inputs to the shared TAP pad cells. More specifically, performing the LBIST using the internally generated digital clock signal may include controlling, by the auxiliary logic circuit and the LBIST logic circuit, driver parameters and receiver parameters of shared Test Access Port (TAP) pad cells of the I/O pad cells using the digital logic sequences.

In more specific and related embodiments, the switch circuitry includes the auxiliary logic circuit and a clock switch circuit. The method further includes using the auxiliary logic circuit to switch or flip to the LBIST mode including providing an LBIST enable signal by the auxiliary logic circuit to the clock switch circuit, the clock switch circuit rerouting the internally generated digital clock signal to the functional logic circuitry and the LBIST logic circuit in response to the LBIST enable signal. In specific embodiments, a TAP control logic circuit sets the switch circuitry to a first state and, therein, provides the LBIST enable signal to start the LBIST. The LBIST logic circuit may set the switch circuitry to a second state via an LBIST finish signal and the method further includes providing, by the LBIST logic circuit, results of the LBIST to the functional logic circuitry.

In a further related and more specific embodiment, the method further includes using automatic test pattern generator (ATPG) computer-readable instructions to generate and provide the digital logic sequences to the LBIST logic circuit internal to the IC based on remodeling analog components of the I/O pad cells of the IC to a digital form. For example, the method includes providing the digital logic sequences, by a processor executing ATPG computer-readable instructions, to the LBIST logic circuit based on a digital model of the I/O pad cells, and performing the LBIST further includes testing pad cell functions of the I/O pad cells and leakage of the I/O pad cells. Providing the digital model of the I/O pad cells may include digitally remodeling of the I/O pads in an analog form based on pull-up, pull-down, and bus keeper input signals of the I/O pad cells and/or to include a remodeling using a digital representation of a pseudo-random access memory (RAM) that provides a status of a charge on an I/O pin of the I/O pad cells relative to a previous charge on the I/O pin.

In another specific embodiments, an apparatus includes an IC, switch circuitry, and an LBIST logic circuit. The IC includes a plurality of I/O pad cells and functional logic circuitry. The switch circuitry of the IC is to change modes of operation associated with the functional logic circuitry, the modes of operation including an LBIST mode and application mode, and provide an internally generated digital clock signal to the functional logic circuitry and an LBIST logic circuit in response to the LBIST mode. The LBIST logic circuit of the IC is to perform an LBIST using the internally generated digital clock signal to test selected nodes in the IC via control of the functional logic circuitry and via application of digital logic sequences provided as inputs to the I/O pad cells of the IC.

The switch circuitry, in related and more specific embodiments, includes an auxiliary logic circuit and a clock switch circuit. The auxiliary logic circuit change the modes of operation and the clock switch circuit selectively provides one of the internally generated digital clock signal and an external clock signal to the functional logic circuitry in response to the auxiliary logic circuit. For example, the auxiliary logic circuit is a flip-flop switch circuit that is set to the first state and the second state by the TAP control logic circuit and the LBIST logic circuit. The clock switch circuit selectively provides the internally generated digital clock signal in response to the LBIST enable signal and the external clock signal in response to the LBIST finish signal. The auxiliary logic circuit may be reset in response to the LBIST finish signal output by the LBIST logic circuit. The reset of the auxiliary logic circuit causes the clock switch circuit to selectively provide the external clock signal.

In other related embodiments, the IC further includes logic which embeds the LBIST logic circuit and the switch circuitry. The IC includes a phase locked loop circuit to internally generate the digital clock signal, a TAP control logic circuit, and logic isolation circuitry. The TAP control logic circuit sets the switch circuitry to a first state in response to an external test signal and, therein, provides an LBIST enable signal to start the LBIST. The LBIST logic circuit sets the switch circuitry to a second state by providing an LBIST finish signal. The TAP control logic circuit may be clocked by an external clock signal. The logic isolation circuitry is arranged between the I/O pad cells and the TAP control logic circuit and the LBIST logic circuit, wherein the LBIST logic circuit is to provide results of the LBIST to the functional logic circuitry in response to the LBIST finish signal.

In various embodiments, the LBIST logic circuit is to perform the LBIST including accessing all pad cell paths of the I/O pad cells of the IC using the application of the digital logic sequences, and performing a functional safety LBIST in the field. The LBIST logic circuit performs the LBIST including testing internal paths from a pad cell driver to a pad cell receiver of shared TAP pad cells of the I/O pad cells using the application of at least a portion of the digital logic sequences provided as inputs to the shared TAP pad cells.

The apparatus may further include a processor to execute ATPG computer-readable instructions to generate the digital logic sequences based on remodeling analog components of the/O pad cells of the IC to a digital form and to provide the digital logic sequences to the LBIST logic circuit. For example, the ATPG, including computer-readable instructions executed by a processor, is to digitally remodel the I/O pad cells in an analog form based on pull-up, pull-down, and bus keeper input signals of the I/O pad cells and to include a remodeling using a digital representation of a pseudo-RAM that provides a status of a charge on an I/O pin of the I/O pad cells relative to a previous charge on the I/O pin. The LBIST logic circuit is to use the digital logic sequences to test pad cell functions of the I/O pad cells, leakage of the I/O pad cells, and internal paths from a pad cell driver to a pad cell receiver of shared TAP pad cells.

In other specific example embodiments, the apparatus may further include a printed circuit board (PCB) having a plurality of ICs including the IC and a field test master circuit. The field test master circuit performs the LBIST of each of the plurality of ICs by, for testing one of the plurality ICs at a time, including setting I/O pad cells of remaining plurality of ICs to high impedance while testing the one of the plurality of ICs.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving a logic built-in self-test (LBIST) that includes use of an internally generated digital clock signal. In certain implementations, aspects of the present disclosure have been shown to be beneficial when used in the context of an LBIST in which an LBIST logic circuit is provided access to test any or all pad cell paths of input/output (I/O) pad cells of the IC. In some embodiments, the LBIST is performed in the field using an LBIST logic circuit and an auxiliary logic circuit. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

For many ICs, such as safety-critical ICs, a scan test by an on-chip module may be performed. The on-chip scan test is often referred to as an LBIST. The LBIST may be performed using a Test Access Port (TAP) control logic circuit and associated TAP input/output (I/O) pad cells for starting the LBIST and clocking the LBIST circuit that provides the scan sequences. The TAP pad cells are used to receive external signals for clocking and starting the LBIST, and provide the signals to the TAP control logic circuit. TAP pads are often shared with functional pads for reducing the total number of I/O pad cells, herein sometimes referred to as "shared TAP pad cells". During performance of the LBIST, the I/O pad cells can be tested using the internal path from pad cell driver to pad cell receiver. In accordance with various embodiments, the internal cell paths of the shared TAP pad cells can be tested by using an internally generated digital clock during the LBIST in place of an externally generated clock through the use of an auxiliary logic circuit embedded on the IC. The auxiliary logic circuit may be used to place the shared TAP pad cells and other I/O pad cells into a mode controlled by scan testable functional logic and to apply the internally generated digital clock to the testable functional logic such that the shared TAP pad cells are tested as functional I/O pad cells instead of TAP pad cells. During normal operation of the IC and the associated functional logic, if the externally generated clock is used, the internal paths of the shared TAP pad cells may not be tested as their logic state and direction is mandated by clocking and maintaining the LBIST mode. By testing the shared TAP pad cells, in accordance with various embodiments, the above-described test gap is removed. Such a test gap may be unacceptable in highly safety-critical ICs as pad cells are often exposed to electrostatic discharge (ESD) and other forms of electrical overstress.

Embodiments in accordance with the present disclosure include methods and/or apparatuses involving performing an LBIST in which internal pad cell paths of any I/O pad cell, including shared TAP pad cells, may be tested. In addition to testing the shared TAP pad cells using the internally generated digital clock signal, the LBIST includes testing pad cell functions (e.g., pull up, pull down, bus keeper) of the I/O pad cells and leakage of the I/O pad cells by remodeling the I/O pad cells. For example, an automatic test pattern generator (ATPG) using computer-readable instructions (e.g., a computer program and/or software) may be used to design the LBIST logic circuit and the respective digital logic sequences provided as inputs to the I/O pad cells during the LBIST. The ATPG computer-readable instructions are provided with a digital remodeled version of the I/O pad cells. The analog form of the I/O pad cells may be remodeled into a digital representation that remodels the analog components based on pull-up, pull-down, and bus keeper input signals of the I/O pad cells and remodels using a digital representation of a pseudo-random access memory (RAM) that provides a status of a charge on an I/O pin of the I/O pad cell relative to a previous charge on the I/O pin. Using the digital remodeling, the pad functions like pull-up, pull-down or bus keeper and the leakage of the I/O pad cells may be tested. By testing the shared TAP pad cells, the pad cell functions, and leakage of the I/O pad cells, the LBIST performed has high test coverage and low defective parts per million (DPPM) rate in general.

As an example embodiment, a method is directed to providing an LBIST for an IC using an LBIST logic circuit and an auxiliary logic circuit. The method includes using switch circuitry in an IC, the IC including functional logic circuitry and I/O pad cells, to change modes of operation associated with the functional logic circuitry, the modes of operation including an LBIST mode and an application mode, and to provide an internally generated digital clock signal to the functional logic circuitry and an LBIST logic circuit of the IC in response to the LBIST mode. The method further includes performing an LBIST using the internally generated digital clock signal, the LBIST logic circuit and the auxiliary logic circuit to test select nodes in the IC via control of the functional logic circuitry and via application of digital logic sequences provided as inputs to the I/O pad cells of the IC.

In related embodiments, performing the LBIST includes using the internally generated digital clock signal to start the LBIST and clock the LBIST logic circuit and testing internal paths from a pad cell driver to a pad cell receiver of shared TAP pad cells of the I/O pad cells using the application of at least a portion of the digital logic sequences provided as the inputs to the shared TAP pad cells. For example, performing the LBIST using the internally generated digital clock signal and auxiliary logic circuit includes controlling, by the auxiliary logic circuit and the LBIST logic circuit, driver parameters and receiver parameters of shared Test Access Port (TAP) pad cells of the I/O pad cells using the digital logic sequences.

In further related and more specific embodiments, the method further includes using ATPG computer-readable instructions to generate and provide the digital logic sequences to the LBIST logic circuit based on remodeling analog components of the I/O pad cells of the IC to a digital form. For example, the method includes providing the digital logic sequences, by a processor executing ATPG computer-readable instructions, to the LBIST logic circuit based on a digital model of the I/O pad cells, and performing the LBIST further includes testing pad cell functions of the I/O pad cells and leakage of the I/O pad cells. Providing the digital model of the I/O pad cells may include digitally remodeling of the I/O pads in an analog form based on pull-up, pull-down, and bus keeper input signals of the I/O pad cells and to include a remodeling using a digital representation of a pseudo-RAM that provides a status of a charge on an I/O pin of the I/O pad cell relative to a previous charge on the I/O pin.

Other specific example embodiments are directed to an apparatus that includes an IC, switch circuitry, and an LBIST logic circuit. The IC may include an IC chip which embeds the LBIST logic circuit and the switch circuitry. The LBIST logic circuit is to perform the LBIST including accessing any or all pad cell paths of the I/O pad cell of the IC using the application of the digital logic sequences, and performing a functional safety LBIST in the field. The LBIST logic circuit is to use the digital logic sequences to test pad cell functions of the I/O pad cells, leakage of the I/O pad cells, and internal paths from a pad cell driver to a pad cell receiver of shared TAP pad cells.

In other specific example embodiments, the apparatus may further include a printed circuit board (PCB) having a plurality of ICs including the IC and a field test master circuit. The field test master circuit performs the LBIST of each of the plurality of ICs by testing one of the plurality ICs at a time including setting I/O pad cells of remaining plurality of ICs to high impedance while testing the one of the plurality of ICs.

Figure 1:
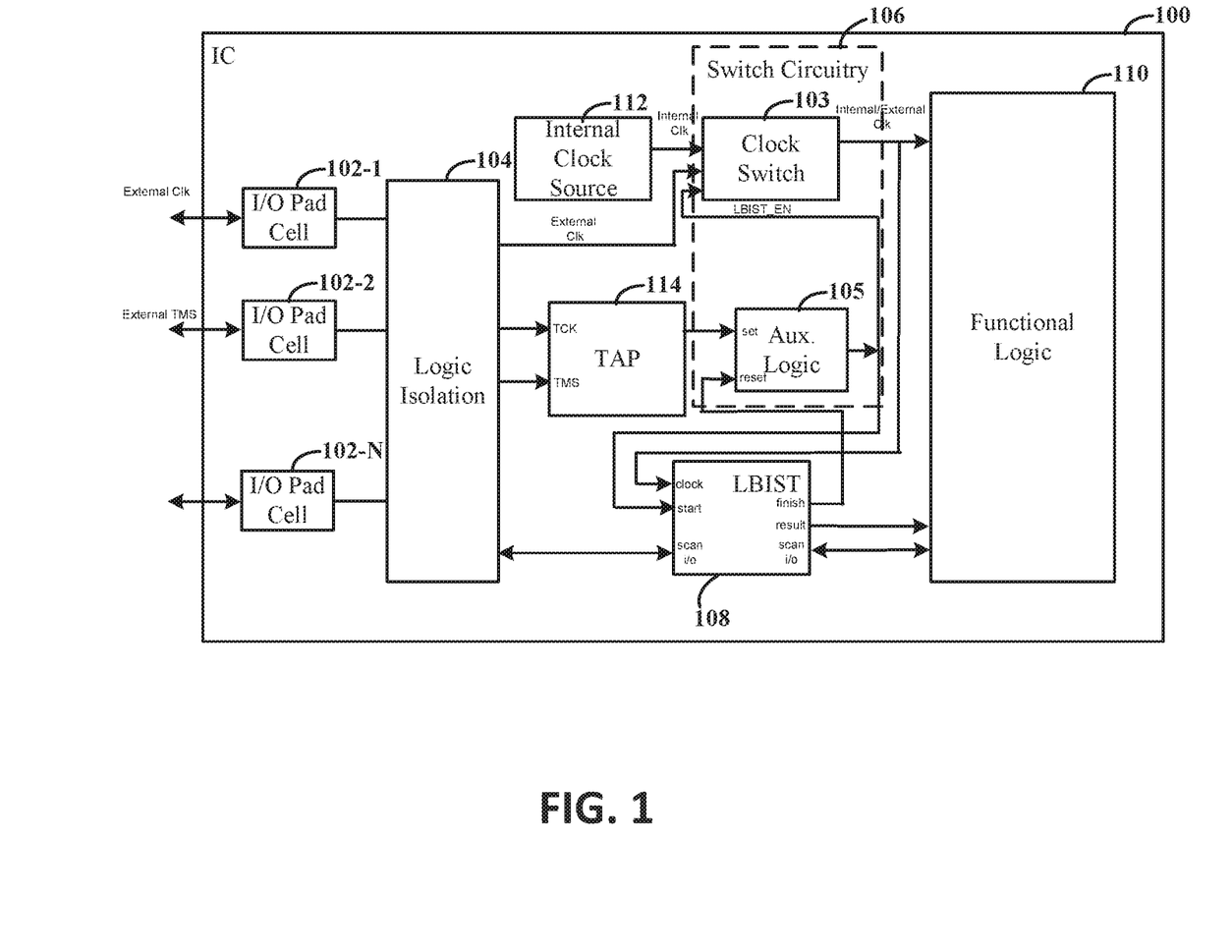
FIG. 1 illustrates an example apparatus for providing a logic built-in self-test (LBIST) for an integrated circuit (IC), in accordance with the present disclosure.

Turning now to the figures, FIG. 1 illustrates an example apparatus for providing an LBIST for an IC, in accordance with the present disclosure. The IC 100 may include a safety-critical functional logic circuitry 110 in which it may be advantageous to perform the LBIST while the IC 100 is in the field. The LBIST may be performed on the IC 100 using the embedded LBIST logic circuit 108 and the embedded auxiliary logic circuit 105.

The IC 100 includes an LBIST logic circuit 108, functional logic circuitry 110 and a plurality of I/O pad cells 102-1, 102-2 . . . 102-N, herein generally referred to as I/O pad cells 102. The I/O pad cells 102 connect to external circuitry, sometimes illustrated as I/O. At least a portion of the I/O pad cells 102 includes shared TAP pad cells, as previously described. The shared TAP pad cells, along with TAP control logic circuit 114, are used to start an LBIST and clock the LBIST. In the specific example of FIG. 1, the I/O pad cells 102-1, 102-2 are shared TAP pad cells used to receive an external clock signal, e.g., TCK, and external test mode select (TMS) signal to start the LBIST.

The IC 100 includes switch circuitry 106 used to change modes of operation associated with the functional logic circuitry 110. The modes of operation may include an LBIST mode and an (normal) application mode. In response to the LBIST mode, the switch circuitry 106 provides an internally generated digital clock signal to the functional logic circuitry 110 and the LBIST logic circuit 108. The internally generated digital clock signal is generated by a clock source 112 internal to the IC 100. In specific examples, the clock source 112 is a phase locked loop (PLL). As further described herein, the LBIST logic circuit 108 may perform the LBIST and is clocked by the switch circuitry 106 and started by an LBIST enable signal, with the TAP control logic circuit 114 and the shared TAP pad cells being used for clocking and starting the LBIST.

The switch circuitry 106 may include an auxiliary logic circuit 105 and a clock switch circuit 103. Although embodiments are not so limited and the auxiliary logic circuit 105 may be separate from the switch circuitry 106. The auxiliary logic circuit 105 changes the modes of operation. The clock switch circuit 103 selectively provides the internally generated digital clock signal or an external clock signal to the functional logic circuitry 110 in response to the auxiliary logic circuit 105. For example, the auxiliary logic circuit 105 may be used to switch to the LBIST mode by providing an LBIST enable signal, e.g., LBIST_EN signal, to the clock switch circuit 103. In response to receiving the LBIST enable signal, the clock switch circuit 103 may reroute the internally generated digital clock signal to the functional logic circuitry 110 and the LBIST logic circuit 108.

In specific embodiments, the switch circuitry 106 is set in a first state and a second state by the TAP control logic circuit 114 and the LBIST logic circuit 108. For example, the TAP control logic circuit 114 sets the auxiliary logic circuit 105 in the first state to start the LBIST in response to receiving the external test signal (e.g., TMS signal). The LBIST logic circuit 108 sets the auxiliary logic circuit 105 in the second state, as described below. The auxiliary logic circuit 105 may include a flip-flop switch and the first and second states may include a 0 and 1. For example, in response to the TAP control logic circuit 114 setting the auxiliary logic circuit 105 to the first state (e.g., set to 1), the auxiliary logic circuit 105 provides and/or generates the LBIST enable signal to start the LBIST. In response to the auxiliary logic circuit 105 being in the second state (e.g., set to 0), the auxiliary logic circuit 105 is effectively reset. An LBIST finish signal may be provided, by the LBIST logic circuit 108, which resets the auxiliary logic circuit 105. The auxiliary logic circuit 105 being in the second state results in the clock switch circuit 103 outputting the external clock signal.

During the LBIST mode, the LBIST logic circuit 108 uses the internally generated digital clock signal to perform the LBIST. The LBIST may include testing select nodes in the IC 100 via control of the functional logic circuitry 110 and via application of digital logic sequences provided as inputs to the I/O pad cells 102 of the IC 100. The digital logic sequences are provided as inputs by the LBIST logic circuit 108.

In accordance with various embodiments, the LBIST logic circuit 108 may test any or all pad cell paths of the I/O pad cells 102. For example, the LBIST enable signal is used to start the LBIST and the internally generated digital clock signal is used to clock the LBIST logic circuit 108 during the LBIST. The internal paths from a pad cell driver to a pad cell receiver of the shared TAP pad cells may be tested, for example, using the application of at least a portion of the digital logic sequences provided as inputs to the shared TAP pad cells. More specifically, the LBIST logic circuit 108 may control the pad cell driver parameters and pad cell receiver parameters of the shared TAP pad cells and of the non-TAP I/O pad cells using the at least portion of the digital logic sequences. As further described herein, ATPG software, sometimes referred to as "ATPG computer-readable instructions", may be used to generate the LBIST logic circuit 108 internal to the IC 100 based on remodeling analog components of the I/O pad cells 102 of the IC 100 to a digital form. Remodeling analog components may allow for testing of pad cell functions (e.g., pull up, pull down, bus keeper) of the I/O pad cells 102 and leakage of the I/O pad cells 102.

In a number of embodiments, an ATPG, which includes a computing device external to the IC 100 that executes ATPG software, is used to design the LBIST logic circuit 108 including the digital logic sequences. The ATPG software may be executed to provide a digital model of the I/O pad cells 102 by digitally remodeling the I/O pad cells 102 in an analog form based on pull-up, pull-down, and bus keeper input signals of the I/O pad cells 102 and/or to include a remodeling using a digital representation of a pseudo-RAM that provides a status of a charge on an I/O pin of the I/O pad cells 102 relative to a previous charge on the I/O pin. For example, based on the digital model of the I/O pad cells 102, the LBIST performed can include testing pad cell functions (e.g., pull up, pull down, bus keeper) of the I/O pad cells 102 and leakage of the I/O pad cells 102.

In various embodiments, the IC 100 further includes logic isolation circuitry 104. The logic isolation circuitry 104 is arranged between the I/O pad cells 102 and the TAP control logic circuit 114 and the LBIST logic circuit 108. Example logic isolation circuitry 104 may include a wrapper and/or boundary scan logic. Logic isolation of the functional logic circuitry 110 may be used to provide testability of paths between the logic isolation and the functional logic circuitry 110.

The LBIST logic circuit 108 provides results of the LBIST to the functional logic circuitry 110 in response to the LBIST finish signal. As previously described, the LBIST logic circuit 108 may be designed to perform the LBIST including accessing all pad cell paths of the I/O pad cells 102 of the IC 100 using the application of the digital logic sequences, and performing a functional safety LBIST in the field. The LBIST may include testing the shared TAP pad cells, the cell functions of the I/O pad cells, and leakage of the I/O pad cells.

Figure 2:
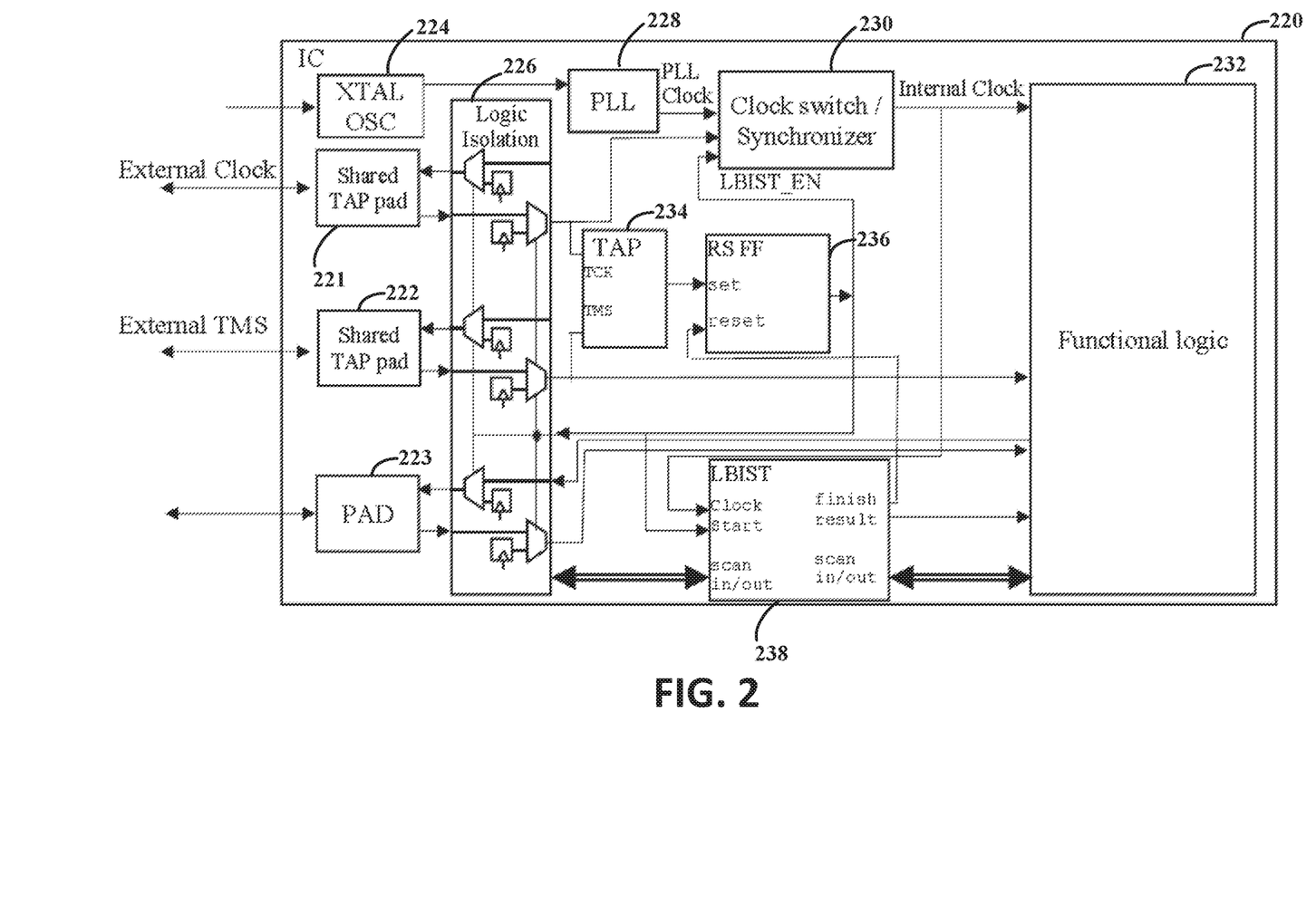
FIG. 2 illustrates another example apparatus for providing an LBIST for an IC, in accordance with the present disclosure.

FIG. 2 illustrates another example apparatus for providing an LBIST for an IC, in accordance with the present disclosure. The apparatus may include an IC 220, such as the IC 100 previously described in connection with FIG. 1.

The IC 220 includes a plurality of I/O pad cells 221, 222, 223 and functional logic circuitry 232. At least a portion of the I/O pad cells 221, 222, 223 includes shared TAP pad cells 221, 222. The IC 220 performs an LBIST using the shared TAP pad cells 221, 222 and the TAP control logic circuit 234 for initiating the LBIST. Such example apparatuses and methods may involve a reduced pin-count TAP, such as proposed by the Institute of Electrical and Electronics Engineers (IEEE) Standard 1149.7. Reduced pin-count TAPs may have two dedicated test pads 221, 222 that are in a test mode during an LBIST, while other I/O pad cells may change directions at least in the scan capture mode. The two TAP pads 221, 222 may be referred to as External Shift Enable, e.g., External SE or TMS, and External Clock, e.g., External CLK.

As described above, the LBIST may include a full fault coverage LBIST in which any pad cell path may be tested by the LBIST logic circuit 238. More specifically, the LBIST logic circuit 238 starts performing the LBIST in response to an LBIST enable signal from an auxiliary logic circuit. In the specific embodiment, the auxiliary logic circuit is a flip-flop switch circuit 236. The LBIST logic circuit 238, in response to the LBIST enable signal, e.g., LBIST_EN, runs the LBIST using an internally generated digital clock signal to test selected nodes in the IC 220 via control of the functional logic circuitry 232 and via application of digital logic sequences provided as inputs to the I/O pad cells 221, 222, 223 of the IC 220.

The IC 220 further includes switch circuitry that includes the auxiliary logic circuit and the clock switch circuit 230. The auxiliary logic circuit, which includes or is the flip-flop switch circuit 236 (and may be separate from the switch circuitry), changes the mode of operation associated with the functional logic circuitry 232 between the LBIST mode and the application mode, as previously described. The clock switch circuit 230 provides the internally generated digital clock signal to the functional logic circuitry 232 and the LBIST logic circuit 238 in response to the LBIST mode.

In the specific embodiment of FIG. 2, the XTAL oscillator 224 clocks the PLL 228 that creates an internally generated digital clock signal and which is used as the shift and capture clock during LBIST, and may also be used as high-frequency capture clock during transition fault test in production test. Pads of the XTAL oscillator 224 may be dedicated analog pins, and the XTAL oscillator 224 and associated pad cells may be tested using the LBIST. For example, the pads of the XTAL oscillator 224 are driven by a tester clock in production testing, and are connected to the XTAL oscillator 224 when in field testing.

The external clock signal is used as the clock (e.g., TCK) for the TAP control logic circuit 234, and as shift and capture clock for LBIST and scan test in production test. The clock switch circuit 230 switches from the external clock signal to the internally generated clock signal, e.g., the PLL clock, and back. The logic isolation circuitry 226, which is transparent in the application mode, allows for controlling and observing the I/O pad cells 221, 222, 223 during the LBIST. This is useful for reduced pin-count test (where only few pad cells are contacted to the production tester), as well as for testing the pad cell receivers.

In specific embodiments, the flip-flop switch circuit 236 generates the LBIST_EN signal and is set by the TAP control logic circuit 234. For example, the flip-flop switch circuit 236 is set to the first state and the second state by the TAP control logic circuit 234 and the LBIST logic circuit 238, resulting in the LBIST_EN signal changing between 1 (e.g., the LBIST is enabled) and 0 (e.g., the LBIST is finished). The TAP control logic circuit 234 may set the flip-flop switch circuit 236 to the first state in response to the external IMS signal. In response to the generated LBIST_EN signal, the LBIST is started. The LBIST logic circuit 238 is clocked by the clock switch circuit 230, and started by the LBIST_EN signal. For example, the clock switch circuit 230 selectively provides the internally generated digital clock signal in response to the LBIST_EN signal.

Once the LBIST is finished, the finish signal of the LBIST logic circuit 238 goes to 1, the flip-flop switch circuit 236 is reset so that the LBIST_EN goes to 0. Additionally, the results of the LBIST (e.g., a simple pass/fail bit) is sent to the functional logic circuitry 232, where the results are stored in a register and can be read out by the production tester.

In the LBIST mode, the LBIST logic circuit 238 controls inputs to the I/O pad cells including the shared TAP pad cells 221, 222. As such, the shared TAP pad cells 221, 222 may be tested during the LBIST mode according to respective settings in the LBIST mode. The internally generated digital clock signal may include application of one clock pulse. The one clock pulse may be placed sufficiently before and after the shift mode clock pulses, and the LBIST may be used to detect stuck-at defects. In specific embodiments, the LBIST logic circuit 238 performs the LBIST including testing internal paths from a pad cell driver to a pad cell receiver of shared TAP pad cells 221, 222 of the I/O pad cells using the application of at least a portion of the digital logic sequences provided as the inputs to the shared TAP pad cells 221, 222, as further illustrated by the timing diagram of FIG. 3.

In related and further specific embodiments, the digital logic sequences are based on a remodeling of the I/O pad cells 221, 222, 223 and are used to test pad cell functions (e.g., pull up, pull down, bus keeper) of the I/O pad cells 221, 222, 223, leakage of the I/O pad cells 221, 222, 223 and/or internal paths from a pad cell driver to a pad cell receiver of shared TAP pad cells 221, 222. The remodeling may occur using ATPG computer-readable instructions, such as by an external computing device executing the ATPG computer-readable instructions, sometimes herein referred to as an "ATPG". The ATPG (e.g., software executed by a processor) generates the digital logic sequences based on remodeling analog components of the I/O pad cells 221, 222, 223 of the IC 220 to a digital form which is used to provide the digital logic sequences to the LBIST logic circuit 238. More specifically, the ATPG is used to design the LBIST logic circuit 238. As previously described, the ATPG may digitally remodel the I/O pad cells 221, 222, 223 in an analog form based on pull-up, pull-down, and bus keeper input signals of the I/O pad cells 221, 222, 223 and to include a remodeling using a digital representation of a pseudo-RAM that provides a status of a charge on an I/O pin of the I/O pad cells 221, 222, 223 relative to a previous charge on the I/O pin. Based on the remodeling, the ATPG generates digital logic sequences which may be used to test pad cell functions (e.g., pull up, pull down, bus keeper) of the I/O pad cells 221, 222, 223, leakage of the I/O pad cells 221, 222, 223, and internal paths from a pad cell driver to a pad cell receiver of shared TAP pad cells 221, 222.

Figure 3:
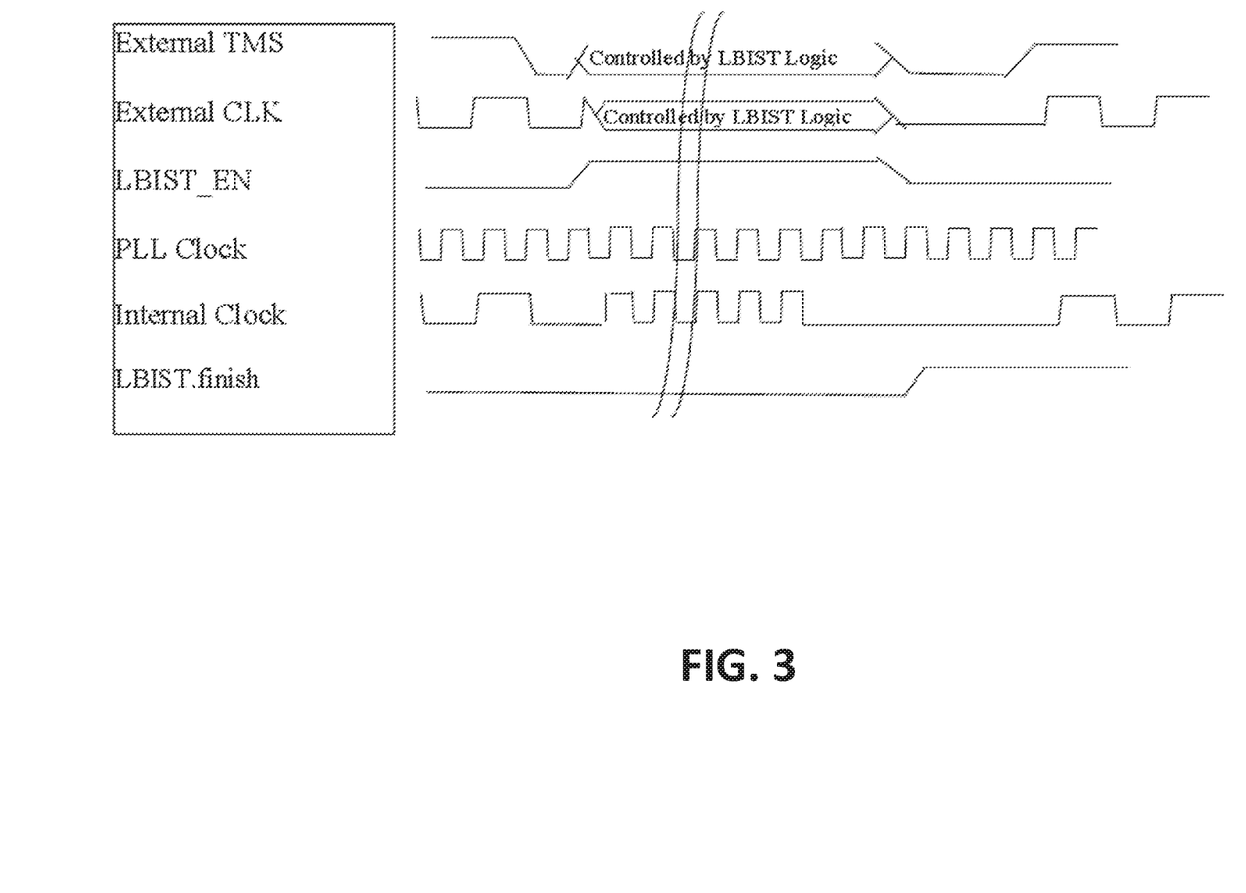
FIG. 3 illustrates example test related signals of an apparatus implemented in a manner consistent with FIG. 2, in accordance with the present disclosure.

FIG. 3 illustrates example test related signals of an apparatus implemented in a manner consistent with FIG. 2, in accordance with the present disclosure. More specifically, the timing diagram illustrates example timings of signals for performing the LBIST. The signals include IC-level signals of two shared TAP pad cells, named here External TMS signal and External CLK signal, as well as the internal signals which are derived from these, and from the PLL clock signal, including the internal LBIST_EN signal, and the internal clock.

The two shared TAP pad cells are controlled by the LBIST logic circuit during LBIST. The LBIST logic circuit may control the values of the driver parameters, e.g., the driver value A and the driver enable A_EN, and the receiver parameters, e.g., pull-up, pull-down, bus keeper, etc. The values are shifted in the scan chain before the respective capture mode of the LBIST. After the LBIST finish signal goes to 1, the LBIST_EN signal hands over the control of the shared TAP pad cells to the production tester.

Figure 4A:
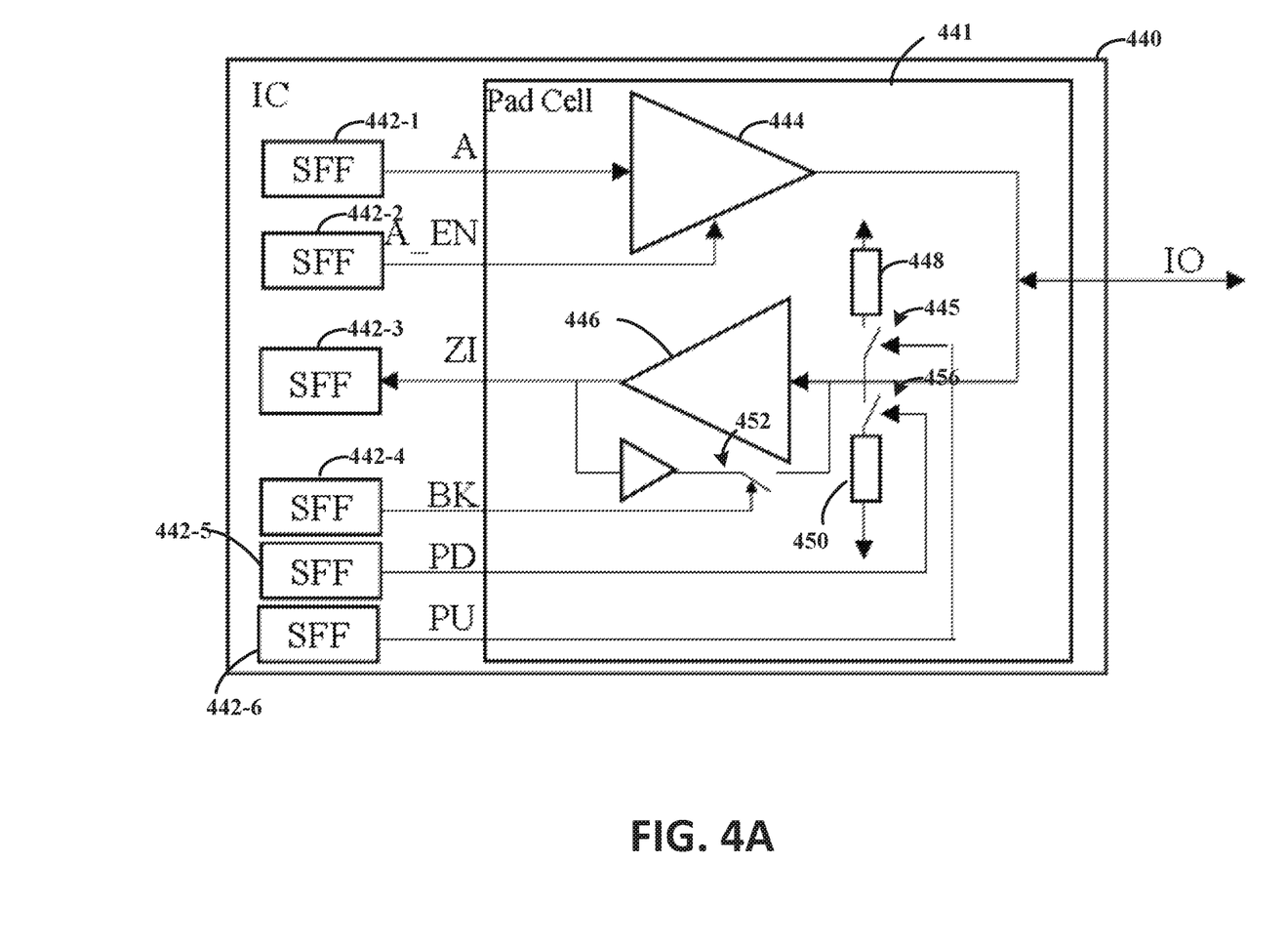
FIGS. 4A-4C illustrate example input/output (I/O) pad cells of an apparatus, in accordance with the present disclosure.
Figure 4B:
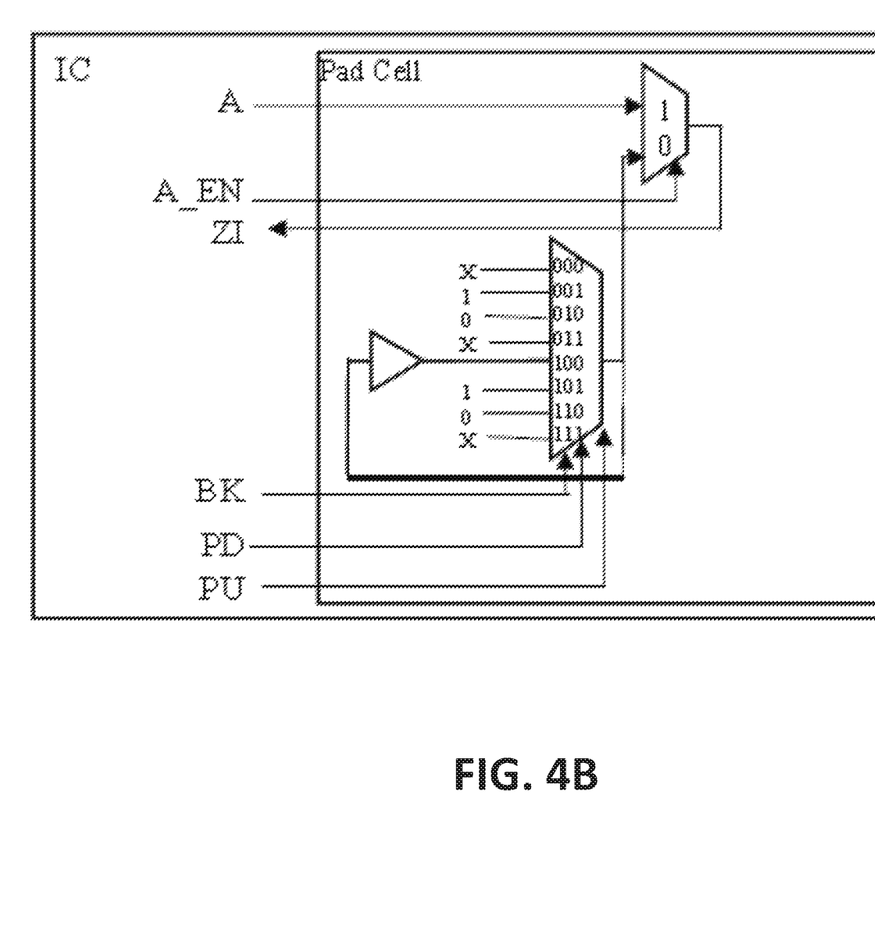
Figure 4C:
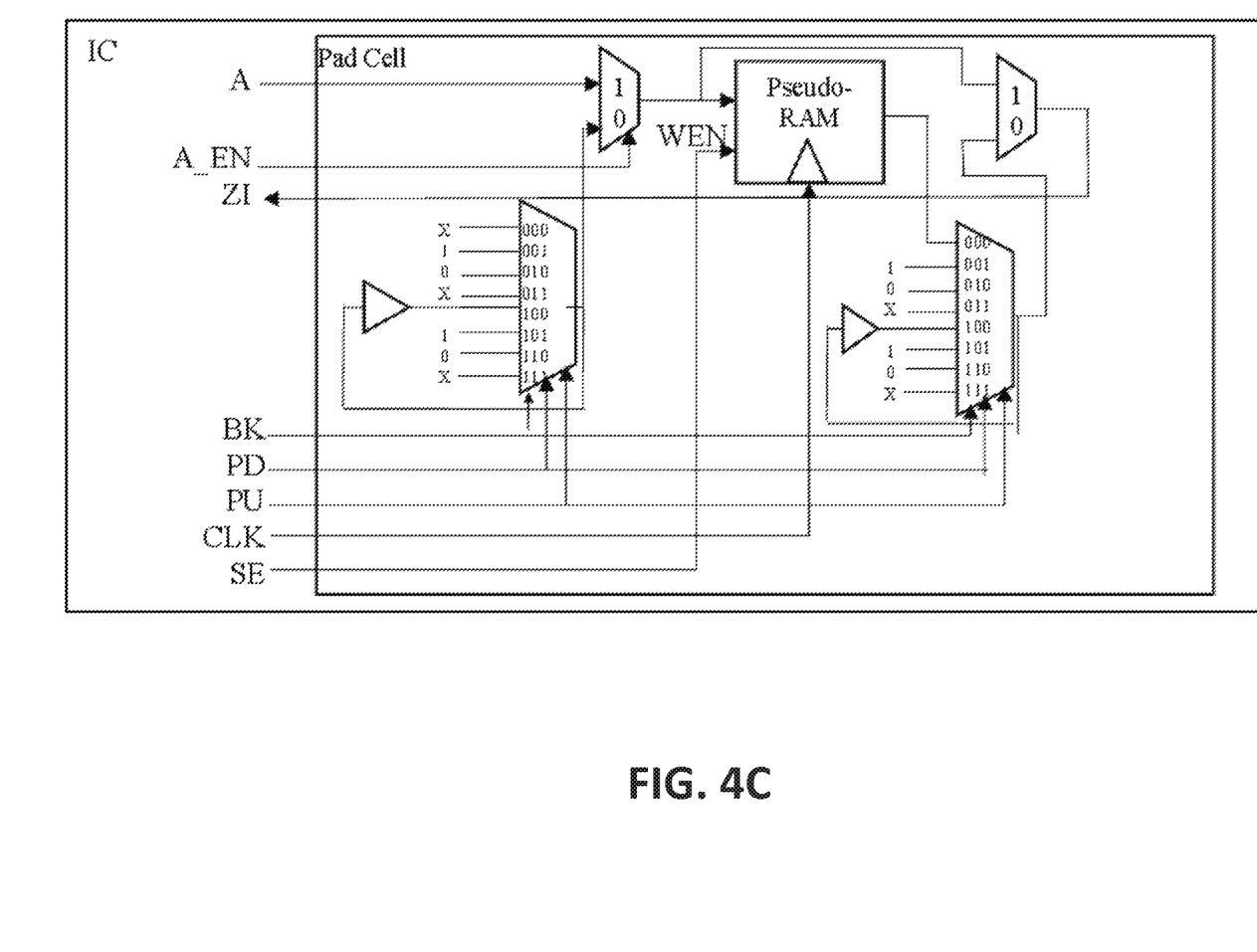

FIGS. 4A-4C illustrate example I/O pad cells of an apparatus, in accordance with the present disclosure. As previously described, the I/O pad cells may be remodeled to generate digital logic sequences for inputting to the I/O pad cells to test cell pad functions. The remodeling may be based on pull-up, pull-down, and bus keeper input signals of the I/O pad cells.

More specifically, the I/O pad cells including the analog components are remodeled into a digital form. The digital form is added to the computer-readable instructions for the ATPG which designs the LBIST logic circuit. Test patterns, e.g., digital logic sequences, created by the LBIST logic circuit are simulated in simulator circuitry, using the analog view of the I/O pad cells.

FIG. 4A illustrates an example of an analog view of an I/O pad cell 441 in an IC 440. In the specific example, the IC 440 includes a plurality of scan flip-flops (SFFs) 442-1, 442-2, 442-3, 442-4, 442-5, 442-6, herein generally referred to as the "SFF 442", per I/O pad cell, with one I/O pad cell 441 illustrated. The I/O pad cell 441 is tested using a path from one SFF 442-1 through the pad cell driver 444, the pad cell receiver 446 and back to another SFF, e.g., SFF 442-3. For the pad cell driver 444, both the signals drive value A and the driver enable A_EN are controlled by separate SFFs 442-1, 442-2. The pad cell receiver 446 has separate SFFs 442-4, 442-5.442-6 to control the input signals Bus Keeper (BK), Pull-Down (PD) and Pull-Up (PU).

As further described herein, control of the input signals of the I/O pad cell 441 is used to test pad cell functions including a stuck-open and/or a stuck-close of any of the three switches 445, 452, 456 (e.g., for PU, PD, and BK), and a stuck-0 or stuck-1 of the switches 445, 452, 456. For testing the pad cell, the connection to the outside (IO) is not driven by the production tester (in production test) or other ICs (for LBIST in the field). This can be performed in production test, and using additional measures for testing in the field as further described herein. For example, the LBIST may be used to identify whether any of the switches are broken, such as in an open or fixed position.

Table 1 below illustrates example signals for testing the pad cell driver 444. Signals driven by the LBIST are shown as 0 or 1; signals expected by the LBIST as L or H. In the driver-off 1 test, the pull-down resistor 450 is active; hence if due to a fault, the driver is not switched off, the state of I/O and hence also input impedance (ZI) is 1 (e.g., this leads to an error), and only if the driver is off, the state is 0 (indicating no error). Similarly, the driver-off 0 test uses the cell-internal pull-up resistor 448. These driver tests can be done by an LBIST using the digital description of the pad cell. Table 1:

TABLE 1

|      | Driver 0 | Driver 1 | Driver-off 0 | Driver-off 1 |
|------|----------|----------|--------------|--------------|
| A    | 0        | 1        | 0            | 1            |
| A_EN | 1        | 1        | 0            | 0            |
| PU   | 1        | 0        | 1            | 0            |
| PD   | 0        | 1        | 0            | 1            |
| BK   | 0        | 0        | 0            | 0            |
| ZI   | L        | H        | H            | L            |

Testing the pad cell receiver 446 may involve two capture mode cycles each, e.g., first charging the (parasitic) I/O capacitance by setting the driver 444 to 0, then charging it by activating the pull-up resistor 448. Table 2 shows the sequences for the pad cell receiver tests. Testing the pad cell receiver 446 may include testing the receiver switches 445, 452, 456 in open and closed positions, as well as the pull-up/pull-down resistors 448, 450 or current sources. To enable an ATPG computer-readable instructions (e.g., software) or the LBIST logic circuit to create scan patterns to test these functions, the cells are remodeled in the digital form. Table 2:

TABLE 2

|      | Pull Down | Pull Up | Bus Keeper 1 | Bus Keeper 0 |
|------|-----------|---------|--------------|--------------|
| A    | 11        | 00      | 11           | 00           |
| A_EN | 10        | 10      | 10           | 10           |
| PU   | 00        | 01      | 00           | 00           |
| PD   | 01        | 00      | 00           | 00           |
| BK   | 00        | 00      | 11           | 11           |
| ZI   | HL        | LH      | HH           | LL           |

FIG. 4B illustrates a specific example of remodeling of the I/O pad cell illustrated by FIG. 4A based on the PU, PD, and BK signals. The LBIST logic circuit is provided with the remodeled (digital) view (e.g., FIG. 4B), and the simulation is done with the original view (e.g., FIG. 4A). The example results of fault injection runs using a commercial fault simulation software are shown in Table 3:

TABLE 3

|                                    | # faults | # detected (DS, TI) | Test coverage |
|------------------------------------|----------|---------------------|---------------|
| Standard LBIST, shared TAP pads    | 136      | 10                  | 7%            |
| Standard LBIST, functional pads    | 136      | 35                  | 26            |
| Our ID, shared and functional pads | 136      | 111                 | 82%           |

In accordance with various embodiments, the test coverage for shared TAP pad cells and functional I/O pad cells is the same, giving full control of LBIST over the shared TAP pad cells.

The I/O pad cells may be further remodeled to include a digital representation of a pseudo-RAM that provides a status of a charge on an I/O pin of the I/O pad cells relative to a previous charge on the I/O pin. The digital representation of the pseudo-RAM may be used to provide digital logic sequences for testing leakage of the I/O pad cells. A pad cell leakage test in the field is beneficial as electrical overstress, aging, and latent defects manifest in slowly, steadily increasing a leakage current of an I/O pad cell. A high safety level mandates supervising the leakage current in the field, in order to be able to notice an imminent device failure in due time before the actual breakdown. Such leakage tests, using the existing pad cells without modification, and without modifying the existing LBIST infrastructure, includes further remodeling the analog components of the I/O pad cell.

The leakage current of an example pad cell (e.g., in a 40 nm process) is below $I_{Leak}=0.1$ µA even at highest temperature and worst process corner, and the parasitic capacitance is typically at least C=1 pF. The voltage drift due to leakage can be expected to be lower than $I_{Leak}/C=0.1$ V/µs. In this example, 2 µs is a safe value between charging (or discharging) the I/O capacitance using the driver, and capturing the I/O pad's voltage—the IO voltage changes by less than 0.2 V within the 2 µs. At a typical LBIST clock cycle length of 20 ns, these 2 µs mean 100 clock cycles, which in turn, at a typical chain length of 100 flip-flops, means that in one capture cycle the I/O capacitance can be charged, and in the next capture cycle it can be captured. Remodeling the I/O pad cells to include a digital representation of pseudo-RAM can be used to generate digital logic sequences to test for leakage. Table 4 illustrates an example sequence for a leakage test:

TABLE 4

|  | Leakage 0 | Leakage 1 |
|---|---|---|
| A | 00 . . . 0 | 11 . . . 1 |
| A_EN | 10 . . . 0 | 10 . . . 0 |
| PU | 00 . . . 0 | 00 . . . 0 |
| PD | 00 . . . 0 | 00 . . . 0 |
| BK | 00 . . . 0 | 00 . . . 0 |
| ZI | LL . . . L | HH . . . H |

FIG. 4C illustrates an example remodeled I/O pad cell that includes a digital representation of the pseudo-RAM. As previously described, the comparatively long time to observe the voltage across the parasitic capacitance uses measures that may be achieved within more than one capture cycle. For example, the observed voltage is observed from one capture cycle (where the capacitance is charged) until the following one (where it is probed, e.g., checked if the voltage drop during this time was sufficiently low). Remodeling is done using a one-bit pseudo RAM to facilitate the above described LBIST sequential RAM test.

The pseudo-RAM's WriteEnable_Not (WEN) signal is connected to the Shift Enable (SE) signal; hence only in capture modes, the pseudo-RAM can be written. As shown, only in the case PD=PU=BK=0, the contents of the pseudo-RAM is fed to the ZI. The behavior is nearly the same as in remodeled circuit in FIG. 4B—with the exception, that the latter one for PD=PU=BK=0 results in an undefined value ("X") at the ZI.

Figure 5A:
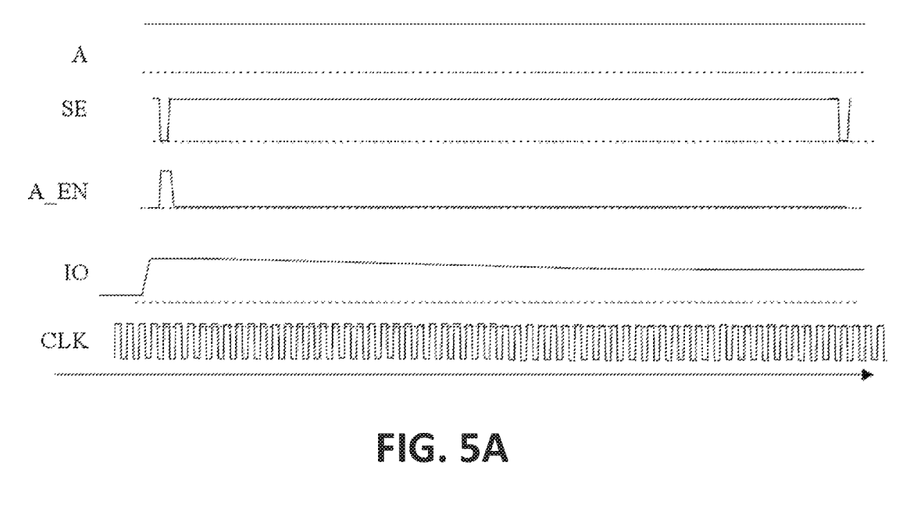
FIGS. 5A-5B illustrate example test related signals of an apparatus having I/O pad cells implemented in a manner consistent with FIGS. 4A-4C, in accordance with the present disclosure.
Figure 5B:
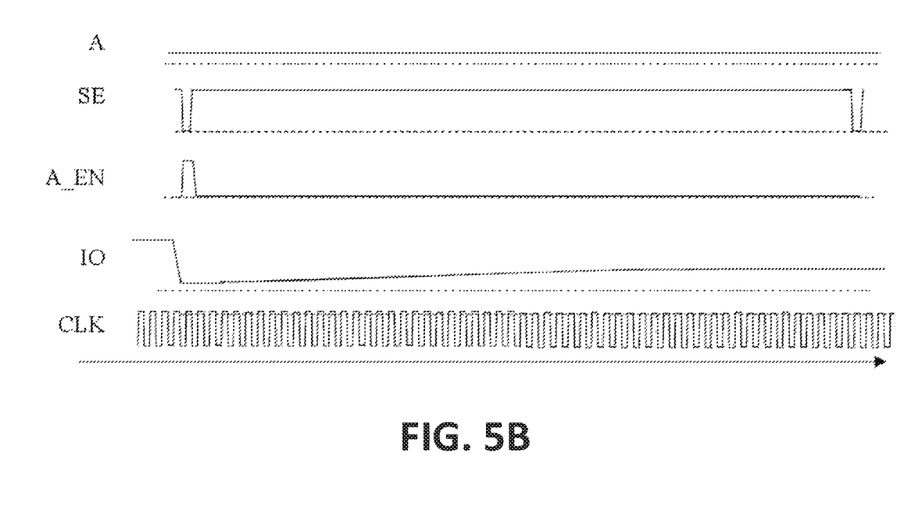

FIGS. 5A-5B illustrate example test related signals of an apparatus having I/O pads implemented in a manner consistent with FIGS. 4A-4C, in accordance with the present disclosure. More specifically, the timing diagram illustrates example timings of signals for performing the LBIST to test leakage of the I/O pad cells based on the remodel illustrated by FIG. 4C. The timing of the relevant signals (A, SE, A_EN, the voltage on the IO port and the CLK) is shown in FIG. 5A for charging with 1 and FIG. 5B for charging with 0.

The above described IC may be used to perform a reduced pin count production test. In such embodiments, production tests of single ICs are performed using scan test and/or LBIST. Such embodiments allow for reduced pin count test with a high test coverage. In reduced pin count test, ideally only TAP pins are contacted to digital ATE channels, all other pins are tested via scan test or LBIST. Testing the analog components of complex pad cells, testing the shared TAP pads in both directions, and leakage tests are possible, even though the respective pins are not connected to the tester.

In other embodiments and/or in addition, the above described IC may be used to perform an LBIST in the field with several ICs on a printed circuit board (PCB).

Figure 6:
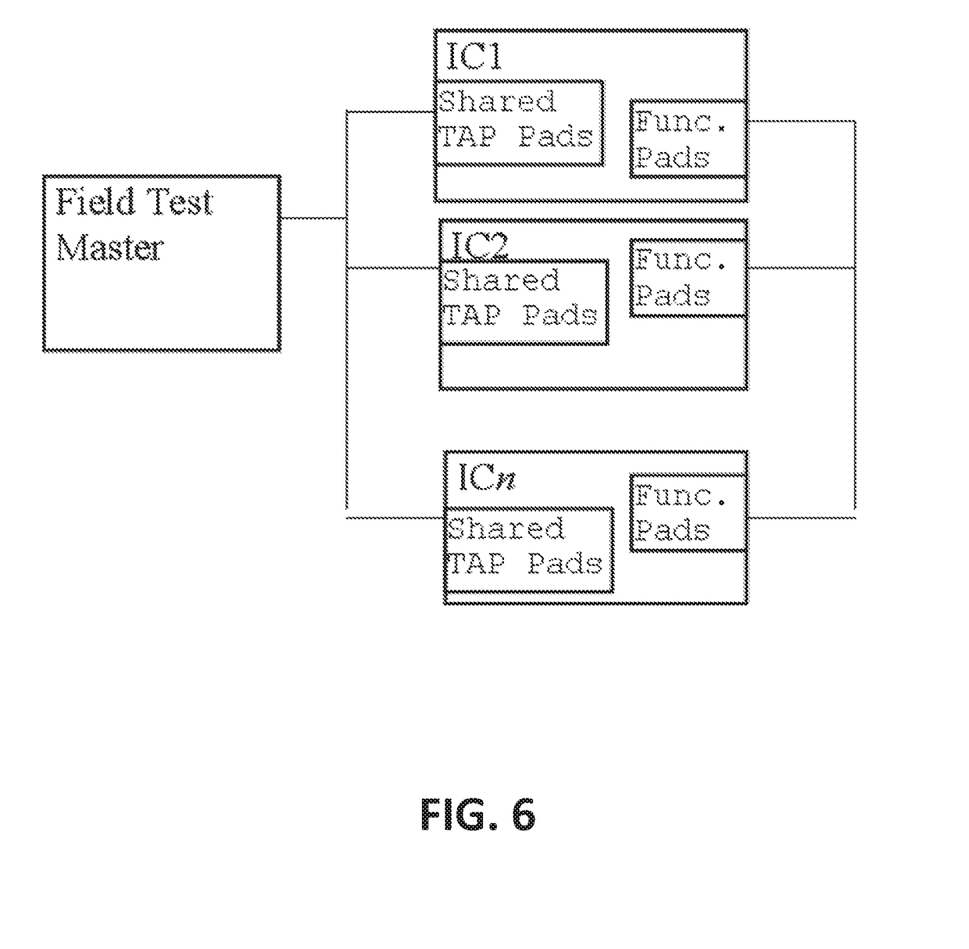
FIG. 6 illustrates an apparatus having a plurality of ICs, in accordance with the present disclosure.

FIG. 6 illustrates an apparatus having a plurality of ICs, in accordance with the present disclosure. Field test may involve testing the ICs on a PCB one after the other, setting the I/O pad cells of all other ICs connected to high-Z, and this requires a field test master, as shown in FIG. 6.

Figure 7:
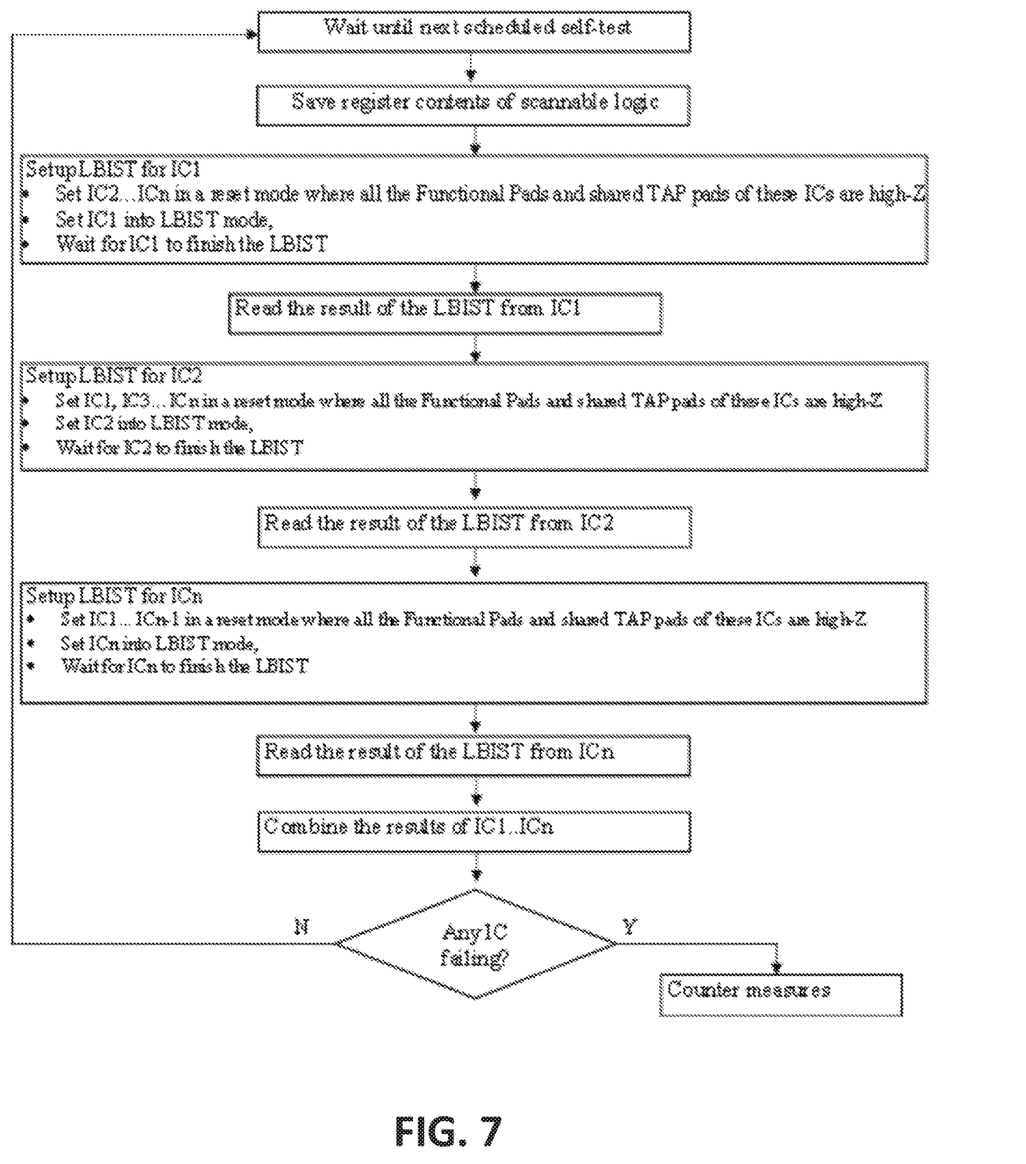
FIG. 7 is a flow chart illustrating an exemplary set of activities and/or data flow for an apparatus of the type implemented in a manner consistent with FIG. 6, in accordance with the present disclosure.

FIG. 7 is a flow chart illustrating an exemplary set of activities and/or data flow for an apparatus of the type implemented in a manner consistent with FIG. 6, in accordance with the present disclosure.

Embodiments in accordance with the present disclosure are directed to an IC and methods of performing on LBIST using the IC in the field. The IC has improved stuck-at test covered for pad cells that are shared between TAP and functional logic, and improved stuck-at test coverage for complex functional pad cells. Additionally, test coverage is provided for pad cell leakage, which is mandated for many functional safety concerns. The improved test coverage is provided by using an internal clock signal and asserting signals for the LBIST using dedicated LBIST logic circuitry, as well as remodeling of the analog components of the pad cells to a digital form. Such embodiments may be used for ICs that require a high production test coverage, especially for pad cells, particularly if the pad cells are exposed to a higher risk of ESD or other forms of electrical overstress including ICs that require a high Diagnostic Coverage for self-test in the field, in safety-critical applications.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 108, 114, 243, and 238 of FIGS. 1 and 2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 4B-4C and 7. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. As another example, the remodeling illustrated by FIGS. 4B-4C may be used to generate digital logic sequences used by the LBIST logic circuit 238 illustrated by FIG. 2. Such modifications do not depart from the true spirit and scope of various aspects of the disclosure, including aspects set forth in the claims.

What is claimed is:

1. A method for providing a logic built-in self-test (LBIST) for an integrated circuit (IC) using an LBIST logic circuit and an auxiliary logic circuit, comprising:
using switch circuitry in an IC, the IC including functional logic circuitry and input/output (I/O) pad cells, to:
change modes of operation associated with the functional logic circuitry, the modes of operation including an LBIST mode and an application mode; and
provide an internally generated digital clock signal to the functional logic circuitry and an LBIST logic circuit of the IC in response to the LBIST mode; and
performing an LBIST using the internally generated digital clock signal, the LBIST logic circuit and an auxiliary logic circuit to test select nodes in the IC via control of the functional logic circuitry and via application of digital logic sequences provided as inputs to the I/O pad cells of the IC.

2. The method of claim 1, further including generating the digital clock signal using a phase locked loop circuit of the IC, wherein performing the LBIST includes using the internally generated digital clock signal to start the LBIST and clock the LBIST logic circuit and testing internal paths from a pad cell driver to a pad cell receiver of shared Test Access Port (TAP) pad cells of the/O pad cells using the application of at least a portion of digital logic sequences provided as the inputs to the shared TAP pad cells.

3. The method of claim 1, wherein the switch circuitry includes the auxiliary logic circuit and performing the LBIST using the internally generated digital clock signal and the auxiliary logic circuit including controlling, by the auxiliary logic circuit and the LBIST logic circuit, driver parameters and receiver parameters of shared Test Access Port (TAP) pad cells of the I/O pad cells using the digital logic sequences.

4. The method of claim 1, further including using automatic test pattern generator (ATPG) computer-readable instructions to generate and provide the digital logic sequences to the LBIST logic circuit internal to the IC based on remodeling analog components of the I/O pad cells of the IC to a digital form.

5. The method of claim 1, wherein performing the LBIST includes providing the LBIST logic circuit access to all pad cell paths of the I/O pad cells of the IC.

6. The method of claim 1, the switch circuitry includes the auxiliary logic circuit and a clock switch circuit, and the method further including using the auxiliary logic circuit to switch to the LBIST mode including providing an LBIST enable signal by the auxiliary logic circuit to the clock switch circuit, the clock switch circuit rerouting the internally generated digital clock signal to the functional logic circuitry and the LBIST logic circuit in response to the LBIST enable signal.

7. The method of claim 6, further include setting, by Test Access Port (TAP) control logic circuit, the switch circuitry to a first state and, therein, providing the LBIST enable signal to start the LBIST and setting, by the LBIST logic circuit, the switch circuitry to a second state, therein providing an LBIST finish signal and providing results of the LBIST to the functional logic circuitry.

8. The method of claim 1, further including providing the digital logic sequences, by a processor executing automatic test pattern generator (ATPG) computer-readable instructions, to the LBIST logic circuit internal to the IC based on a digital model of the I/O pad cells, and performing the LBIST further includes testing pad cell functions of the I/O pad cells and leakage of the I/O pad cells.

9. The method of claim 8, further including providing the digital model of the I/O pad cells by digitally remodeling of the I/O pad cells in an analog form based on pull-up, pull-down, and bus keeper input signals of the I/O pad cells and to include a remodeling using a digital representation of a pseudo-random access memory (RAM) that provides a status of a charge on an I/O pin of the I/O pad cells relative to a previous charge on the I/O pin.

10. The method of claim 1, further including providing a digital model of the I/O pad cells by digitally remodeling an analog form of the I/O pad cells based on pull-up, pull-down, and bus keeper input signals of the I/O pad cells and providing the digital logic sequences, by a processor executing automatic test pattern generator (ATPG) computer-readable instructions, to the LBIST logic circuit internal to the IC based on the digital model of the I/O pad cells to test pad cell functions of the I/O pad cells.

11. The method of claim 1, further including providing a digital model of the I/O pad cells by digitally remodeling of the/O pad cells in an analog form to include a remodeling using a digital representation of a pseudo-random access memory (RAM) that provides a status of a charge on an I/O pin of the I/O pad cells relative to a previous charge on the I/O pin and providing the digital logic sequences, by a processor executing automatic test pattern generator (ATPG) computer-readable instructions, to the LBIST logic circuit internal to the IC based on the digital model of the I/O pad cells to test leakage of the I/O pad cells.

12. An apparatus comprising:
an integrated circuit (IC) including a plurality of input/output (I/O) pad cells and functional logic circuitry;
switch circuitry of the IC to:
change modes of operation associated with the functional logic circuitry, the modes of operation including a logic built-in self-test (LBIST) mode and application mode, and
provide an internally generated digital clock signal to the functional logic circuitry and an LBIST logic circuit in response to the LBIST mode; and
the LBIST logic circuit of the IC to perform an LBIST using the internally generated digital clock signal to test selected nodes in the IC via control of the functional logic circuitry and via application of digital logic sequences provided as inputs to the I/O pad cells of the IC.

13. The apparatus of claim 12, wherein the switch circuitry includes:
an auxiliary logic circuit to change the modes of operation; and
a clock switch circuit to selectively provide the internally generated digital clock signal or an external clock signal to the functional logic circuitry in response to the auxiliary logic circuit.

14. The apparatus of claim 12, wherein the IC further includes an IC chip which embeds the LBIST circuit and the switch circuitry and the IC further includes:
a phase locked loop circuit to internally generate the digital clock signal;
a Test Access Port (TAP) control logic circuit to set the switch circuitry to a first state in response to an external test signal and, therein provide an LBIST enable signal to start the LBIST, wherein the LBIST logic circuit is to set the switch circuitry to a second state, therein provide an LBIST finish signal and the TAP control logic circuit is clocked by an external clock signal; and logic isolation circuitry arranged between the I/O pad cells and the TAP control logic circuit and the LBIST logic circuit, wherein the LBIST logic circuit is to provide results of the LBIST to the functional logic circuitry in response to the LBIST finish signal.

15. The apparatus of claim 14, wherein the switch circuitry includes:
a flip-flop switch circuit that is set to the first state and the second state by the TAP control logic circuit and the LBIST logic circuit; and
a clock switch circuit to selectively provide the internally generated digital clock signal in response to the LBIST enable signal and the external clock signal in response to the LBIST finish signal.

16. The apparatus of claim 12, wherein the LBIST logic circuit is to perform the LBIST including accessing all pad cell paths of the I/O pad cells of the IC using the application of the digital logic sequences, and performing a functional safety LBIST in the field.

17. The apparatus of claim 12, wherein the LBIST logic circuit is to perform the LBIST including testing internal paths from a pad cell driver to a pad cell receiver of shared Test Access Port (TAP) pad cells of the I/O pad cells using the application of at least a portion of digital logic sequences provided as the inputs to the shared TAP pad cells.

18. The apparatus of claim 12, further including a processor to execute automatic test pattern generator (ATPG) computer-readable instructions to generate the digital logic sequences based on remodeling analog components of the I/O pad cells of the IC to a digital form and to provide the digital logic sequences to the LBIST logic circuit.

19. The apparatus of claim 18, wherein the ATPG computer-readable instructions are executed by the processor to digitally remodel the I/O pad cells in an analog form based on pull-up, pull-down, and bus keeper input signals of the I/O pad cells and to include a remodeling using a digital representation of a pseudo-random access memory (RAM) that provides a status of a charge on an I/O pin of the I/O pad cells relative to a previous charge on the I/O pin; and
the LBIST logic circuit is to use the digital logic sequences to test pad cell functions of the I/O pad cells, leakage of the I/O pad cells, and internal paths from a pad cell driver to a pad cell receiver of shared Test Access Port (TAP) pad cells.

20. The apparatus of claim 12, further including a printed circuit board (PCB) having:
a plurality of ICs including the IC; and
a field test master circuit to perform the LBIST of each of the plurality of ICs by, for testing one of the plurality ICs at a time including setting I/O pad cells of remaining plurality of ICs to high impedance while testing the one of the plurality of IC.

* * * * *